(12) United States Patent
Pendharkar

(10) Patent No.: US 8,125,030 B2
(45) Date of Patent: Feb. 28, 2012

(54) HIGH VOLTAGE SCRMOS IN BICMOS PROCESS TECHNOLOGIES

(75) Inventor: Sameer P. Pendharkar, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 213 days.

(21) Appl. No.: 12/694,872

(22) Filed: Jan. 27, 2010

(65) Prior Publication Data

US 2011/0180842 A1    Jul. 28, 2011

(51) Int. Cl.
*H01L 29/66* (2006.01)

(52) U.S. Cl. ........ 257/341; 257/337; 257/343; 257/355; 257/360; 257/E29.256; 257/E29.258

(58) Field of Classification Search ............... 257/337, 257/341, 343, 355, 360, E29.256, E29.285
See application file for complete search history.

(56) References Cited

U.S. PATENT DOCUMENTS

| | | | |
|---|---|---|---|
| 6,614,077 B2 * | 9/2003 | Nakamura et al. | 257/355 |
| 2006/0043487 A1 * | 3/2006 | Pauletti et al. | 257/355 |
| 2006/0145260 A1 * | 7/2006 | Kim | 257/355 |

* cited by examiner

*Primary Examiner* — Tan N Tran
(74) *Attorney, Agent, or Firm* — Jacqueline J. Garner; Wade J. Brady III; Frederick J. Telecky Jr.

(57) ABSTRACT

An integrated circuit containing an SCRMOS transistor. The SCRMOS transistor has one drain structure with a centralized drain diffused region and distributed SCR terminals, and a second drain structure with distributed drain diffused regions and SCR terminals. An MOS gate between the centralized drain diffused region and a source diffused region is shorted to the source diffused region. A process of forming the integrated circuit having the SCRMOS transistor is also disclosed.

20 Claims, 7 Drawing Sheets

HIGH VOLTAGE SCRMOS IN BICMOS PROCESS TECHNOLOGIES

The following co-pending patent application is related and hereby incorporated by reference: U.S. patent application Ser. No. 12/694,808 (Texas Instruments docket number TI-66027, filed simultaneously with this application).

FIELD OF THE INVENTION

This invention relates to the field of integrated circuits. More particularly, this invention relates to MOS transistors in integrated circuits.

BACKGROUND OF THE INVENTION

Metal oxide semiconductor (MOS) transistors integrated with silicon controlled rectifier (SCR) devices, known as SCRMOS transistors, may exhibit degraded reliability from high voltage transients such as ESD events. During high voltage transients, charge carriers may be locally injected into lightly doped regions, causing a reduced voltage at the point of injection, which in turn may lead to more charge carrier injection. Localized charge carrier injection by this mechanism may cause device damage.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit may have an SCRMOS transistor, which is an MOS transistor integrated with an SCR device in which the MOS transistor has more than one drain structure. At least one drain structure, but not all drain structures, has a centralized drain diffused region and a distributed SCR terminal. An MOS gate adjacent to each drain structure having a centralized drain diffused region is electrically coupled to a corresponding adjacent source diffused region.

DETAILED DESCRIPTION

Figure 1:
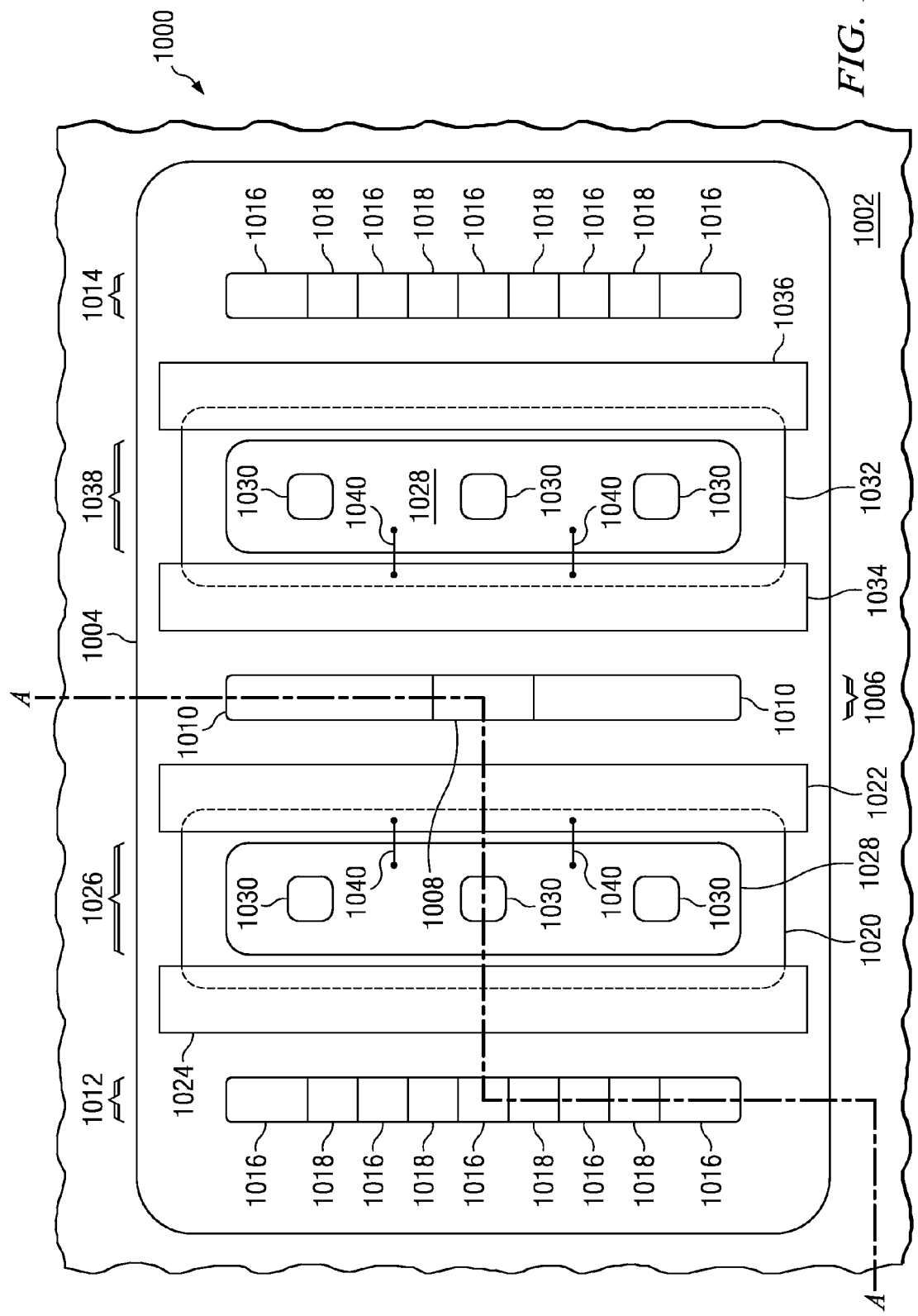
FIG. 1 is a top view of an integrated circuit having an n-channel SCRMOS transistor formed according to a first embodiment.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit may have an SCRMOS transistor which has more than one drain structure. A drain structure of an SCRMOS has a drain diffused region of the MOS transistor and an SCR terminal, which is either an anode diffused region or a cathode diffused region, depending on a polarity of the SCRMOS transistor. The SCR anode or cathode diffused region has an opposite conductivity type from the MOS transistor drain diffused region. At least one drain structure, but not all drain structures, has a centralized drain diffused region and a distributed SCR terminal. An MOS gate adjacent to each localized MOS drain diffused region is electrically coupled to a corresponding adjacent MOS source diffused region.

For the purposes of this specification, a RESURF region will be understood to refer to a semiconductor or dielectric region adjacent to a depletion region which causes the depletion region to be further depleted in a direction different than an applied electric field in the depletion region.

FIG. 1 is a top view of an integrated circuit having an n-channel SCRMOS transistor formed according to a first embodiment. The integrated circuit 1000 is formed in and on a semiconductor substrate 1002. A deep n-type well 1004 commonly known as a deep n-well 1004 is formed in the substrate 1002. Elements of field oxide are not depicted in FIG. 1 for clarity. A first drain structure 1006 has an n-type centralized drain diffused region 1008 and p-type first distributed SCR terminals 1010. the centralized drain diffused region 1008 is centrally located in the first drain structure 1006 and extends less than half a length of the first drain structure 1006. In one realization of the instant embodiment, the centralized drain diffused region 1008 extends less than a third of the first drain structure 1006. The first distributed SCR terminals 1010 extend to each end of the first drain structure 1006.

A second drain structure 1012 and optional third drain structure 1014 are formed in the deep n-well 1004 laterally separated from the first drain structure 1006. The second drain structure 1012 and third drain structure 1014 if present have n-type distributed drain diffused regions 1016 and p-type second distributed SCR terminals 1018. The distributed drain diffused regions 1016 extend substantially to each end of the second drain structure 1012 and third drain structure 1014 if present. In other realizations of the instant embodiment, drain diffused regions and SCR terminals may be configured differently in the second drain structure 1012 and third drain structure 1014 if present than as depicted in FIG. 1.

A p-type first body region 1020 is formed in the deep n-well 1004 between the first drain structure 1006 and the second drain structure 1012. A first MOS gate 1022 is formed over the substrate 1002 overlapping the first body region 1020 adjacent to the first drain structure 1006. A second MOS gate 1024 is formed over the substrate 1002 overlapping the first body region 1020 adjacent to the second drain structure 1012. Sidewall spacers are not shown in FIG. 1 for clarity. Field plates are not shown in FIG. 1 for clarity.

A first source structure 1026 is formed in the first body region 1020. The first source structure 1026 has an n-type source diffused region 1028 and p-type body contact diffused regions 1030. Other realizations of a first source structure with different configurations of source diffused regions and body contact diffused regions are within the scope of the instant embodiment.

The first distributed SCR terminals 1010 form an anode of a first SCR of the n-channel SCRMOS transistor. The centralized drain diffused region 1008 and regions of the deep n-well 1004 between the first drain structure 1006 and the first source structure 1026 form an n-type internal node of the first SCR. The first body region 1020 forms a p-type internal node of the first SCR. The source diffused region 1028 in the first source structure 1026 forms a cathode of the first SCR.

Lateral spaces between the first drain structure 1006 and the first body region 1020 and between the second drain structure 1012 and the first body region 1020 are adjusted so that breakdown between the first drain structure 1006 and the first source structure 1026 is more probable than breakdown between the second drain structure 1012 and the first source structure 1026.

If the third drain structure 1014 is present, a p-type second body region 1032 is formed in the deep n-well 1004 between the first drain structure 1006 and the third drain structure 1014. A third MOS gate 1034 is formed over the substrate 1002 overlapping the second body region 1032 adjacent to the first drain structure 1006. A fourth MOS gate 1036 is formed over the substrate 1002 overlapping the second body region 1032 adjacent to the third drain structure 1014. A second source structure 1038 is formed in the second body region 1032. The second source structure 1038 includes a source diffused region 1028 and body contact diffused regions 1030. Lateral spaces between the first drain structure 1006 and the second body region 1032 and between the third drain structure 1014 and the second body region 1032 are adjusted so that breakdown between the first drain structure 1006 and the second source structure 1038 is more probable than breakdown between the third drain structure 1014 and the second source structure 1038. The first distributed SCR terminals 1010 form an anode of a second SCR of the n-channel SCRMOS transistor. The centralized drain diffused region 1008 and regions of the deep n-well 1004 between the first drain structure 1006 and the second source structure 1038 form an n-type internal node of the second SCR. The second body region 1032 forms a p-type internal node of the second SCR. The source diffused region 1028 in the second source structure 1038 forms a cathode of the second SCR.

The first MOS gate 1022 is electrically coupled to the source diffused region 1028 in the first source structure 1026 as depicted schematically in FIG. 1 by couplers 1040, so as to prevent formation of an inversion layer under the first MOS gate 1022. The third MOS gate 1034 if present is electrically coupled to the source diffused region 1028 in the second source structure 1038 by couplers 1040, so as to prevent formation of an inversion layer under the third MOS gate 1034.

During operation of the integrated circuit 1000, breakdown may occur between the first drain structure 1006 and the first source structure 1026, or between the first drain structure 1006 and the second source structure 1038 if present, as may occur for example in an electrostatic discharge (ESD) event. Breakdown current may trigger SCR current occur between the first drain structure 1006 and the first source structure 1026, or between the first drain structure 1006 and the second source structure 1038 if present, before current filaments form.

Realizations of SCRMOS transistors with other configurations of the first and second drain structures, source structures and other elements of the SCRMOS transistor than that depicted in FIG. 1 are within the scope of the instant embodiment.

It will be recognized that a p-channel SCRMOS transistor may be formed in an integrated circuit as described in reference to FIG. 1, with appropriate changes in polarities of dopants.

Figure 2A:
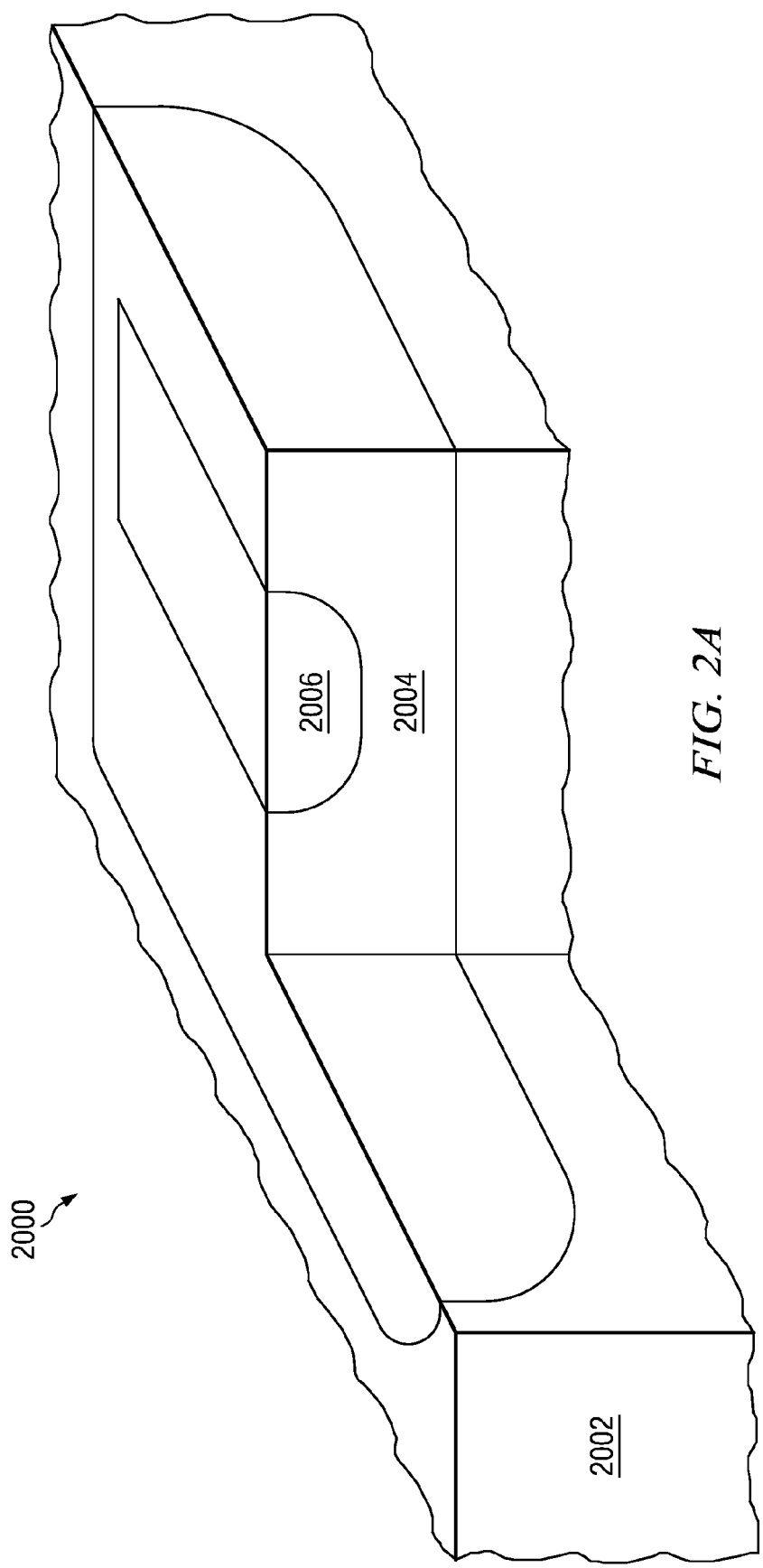
FIG. 2A through FIG. 2C are cross-sections of an integrated circuit containing an n-channel SCRMOS transistor formed according to the embodiment described in reference to FIG. 1, depicted in successive stages of fabrication.
Figure 2B:
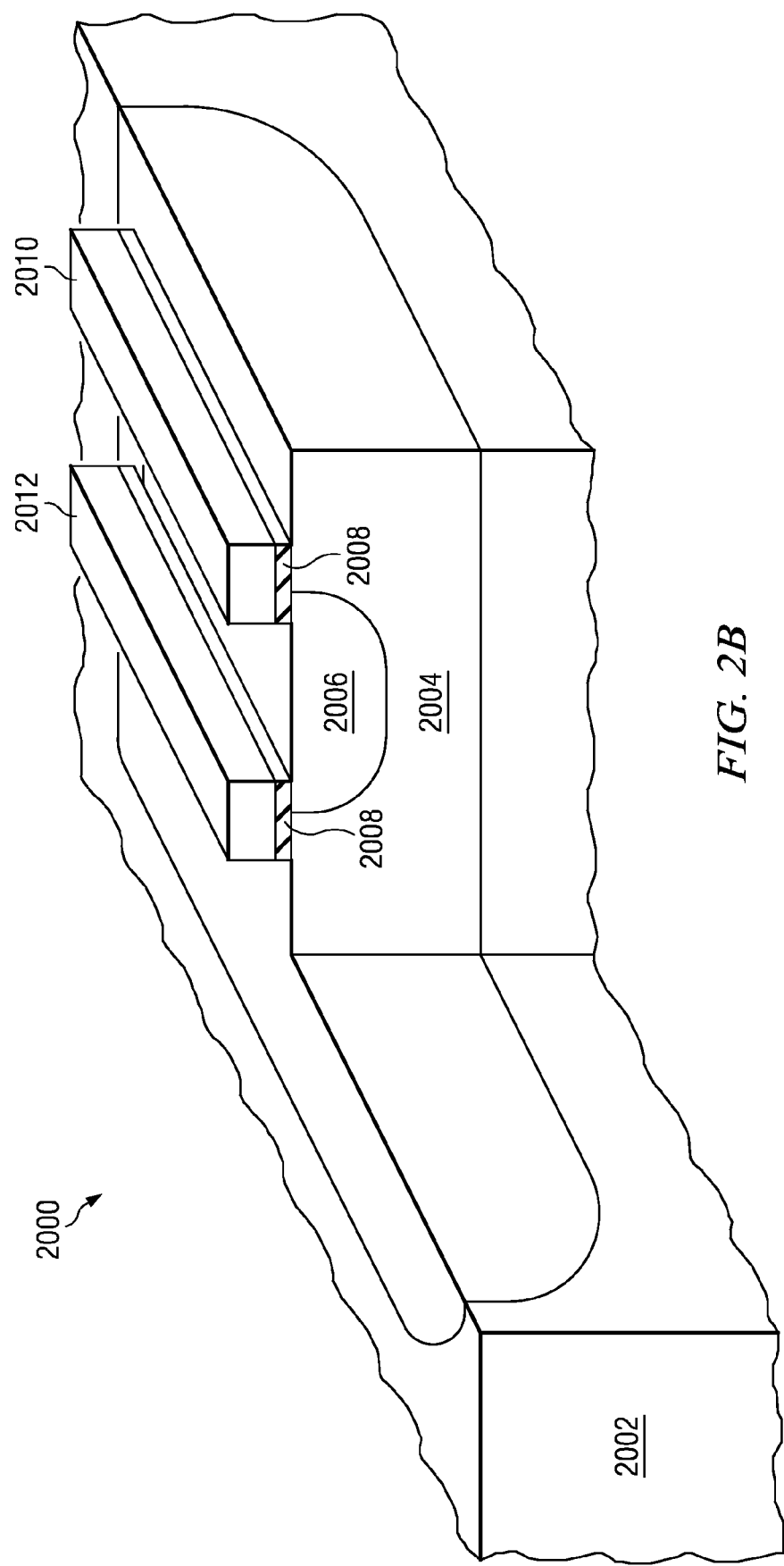
Figure 2C:
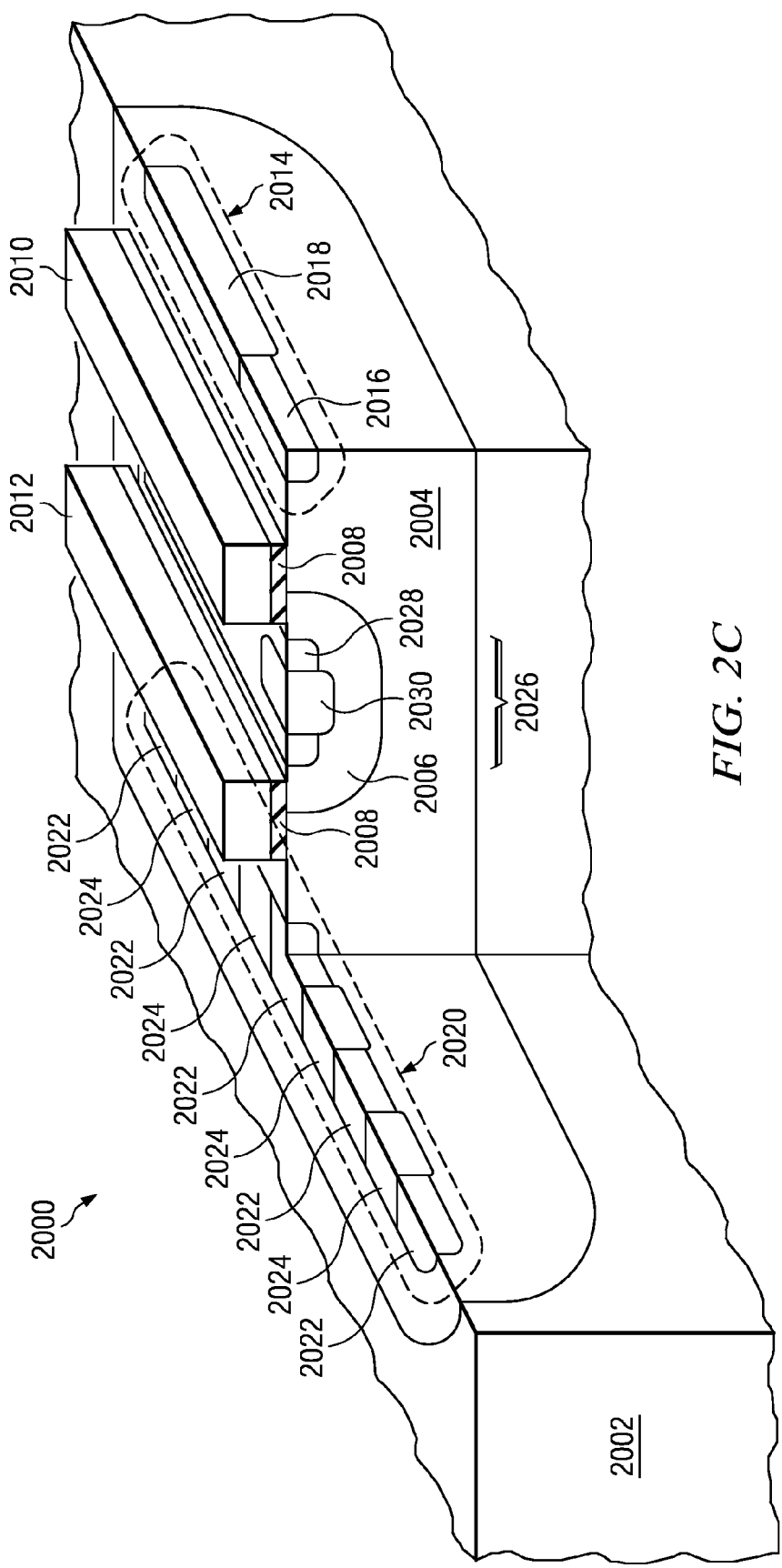

FIG. 2A through FIG. 2C are cross-sections of an integrated circuit containing an n-channel SCRMOS transistor formed according to the embodiment described in reference to FIG. 1, depicted in successive stages of fabrication. The cross-sections in FIG. 2A through FIG. 2C are cut along section line A-A of FIG. 1. Referring to FIG. 2A, the integrated circuit 2000 is formed in and on a semiconductor substrate 2002 which may be a single crystal silicon wafer, a silicon-on-insulator (SOI) wafer, a hybrid orientation technology (HOT) wafer with regions of different crystal orientations, or other material appropriate for fabrication of the integrated circuit 2000. In the instant embodiment, a top layer of the substrate 2002 in a region defined for the SCRMOS transistor is p-type. A deep n-well 2004 is formed in the substrate 2002, for example by ion implanting n-type dopants such as phosphorus, arsenic and antimony into the substrate 2002. In one realization of the instant embodiment, the deep n-well 2004 may be formed by ion implanting phosphorus in a dose between $1\times10^{12}$ and $1\times10^{13}$ atoms/cm$^2$ at an energy between 50 keV and 3 MeV, followed by annealing the integrated circuit at a temperature above 1050 C for more than 4 hours. In one realization of the instant embodiment, a doping density of the deep n-well 2004 may be between $1\times10^{15}$ and $1\times10^{17}$ atoms/cm$^3$. Other processes for forming the deep n-well 2004 are within the scope of the instant embodiment. Elements of field oxide are not shown in FIG. 2A through FIG. 2C for clarity.

A p-type body region 2006 is formed in the source area, for example by ion implanting p-type dopants such as boron and possibly gallium into the substrate 2002. In one realization of the instant embodiment, the body region 2006 may be formed by ion implanting boron in a dose between $5\times10^{13}$ and $5\times10^{14}$ atoms/cm$^2$ at an energy between 200 keV and 500 keV. In one realization of the instant embodiment, a doping density of the body region 2006 may be between $5\times10^{16}$ and $1\times10^{18}$ atoms/cm$^3$.

Referring to FIG. 2B, a gate dielectric layer 2008 is formed on the top surface of the substrate 2002 overlapping the body region 2006. The gate dielectric layer 2008 may be one or more layers of silicon dioxide (SiO$_2$), silicon oxy-nitride (SiON), aluminum oxide (Al$_2$O$_3$), aluminum oxy-nitride (AlON), hafnium oxide (HfO), hafnium silicate (HfSiO), hafnium silicon oxy-nitride (HfSiON), zirconium oxide (ZrO), zirconium silicate (ZrSiO), zirconium silicon oxy-nitride (ZrSiON), a combination of the aforementioned materials, or other insulating material. The gate dielectric layer 2008 may include nitrogen as a result of exposure to a nitrogen containing plasma or a nitrogen containing ambient gas at temperatures between 50 C and 800 C. The gate dielectric layer 2008 is typically between 3 and 15 nanometers thick. The gate dielectric layer 2008 may be formed by any of a variety of gate dielectric formation processes, for example thermal oxidation, plasma nitridation of an oxide layer, and/or dielectric material deposition by atomic layer deposition (ALD).

A first MOS gate 2010 is formed on a top surface of the gate dielectric layer 2008 overlapping a first side of the body region 2006. A second MOS gate 2012 is formed on the top surface of the gate dielectric layer 2008 overlapping a a second side of the body region 2006 opposite the first MOS gate 2010. The first MOS gate 2010 and the second MOS gate 2012 may be formed of polycrystalline silicon commonly known as polysilicon, titanium nitride, or other electrically conductive material. In some realizations of the instant embodiment, MOS gates 2010, 2012 formed of polysilicon may be partially or completely converted to metal silicide such as nickel silicide, cobalt silicide, titanium silicide or platinum silicide. Field plates are not shown in FIG. 2B through FIG. 2C for clarity. Sidewall spacers are not shown in FIG. 2B through FIG. 2C for clarity.

Referring to FIG. 2C, a first drain structure 2014 has an n-type centralized drain diffused region 2016 and a p-type first distributed SCR terminal 2018. The centralized drain diffused region 2016 and the first distributed SCR terminal 2018 are formed in the deep n-well 2004 adjacent to the first MOS gate 2010 opposite the body region 2006. A second drain structure 2020 has n-type distributed drain diffused regions 2022 and p-type second distributed SCR terminals 2024. The distributed drain diffused regions 2022 and second distributed SCR terminals 2024 are formed in the deep n-well 2004 adjacent to the second MOS gate 2012 opposite the body region 2006. The distributed drain diffused regions 2022 extend substantially to each end of the second drain structure 2020.

The centralized drain diffused region 2016 and the distributed drain diffused regions 2022 may be formed by ion implanting n-type dopants into the substrate 2002. In one realization of the instant embodiment, the centralized drain diffused region 2016 may be formed by ion implanting arsenic in a dose between $5 \times 10^{14}$ and $5 \times 10^{15}$ atoms/cm$^2$ at an energy between 20 keV and 60 keV, and ion implanting phosphorus in a dose between $5 \times 10^{13}$ and $5 \times 10^{14}$ atoms/cm$^2$ at an energy between 50 keV and 100 keV.

The first distributed SCR terminal 2018 and the second distributed SCR terminals 2024 may be formed by ion implanting p-type dopants into the substrate 2002. In one realization of the instant embodiment, the first distributed SCR terminal 2018 and the second distributed SCR terminals 2024 may be formed by ion implanting boron in a dose between $1 \times 10^{15}$ and $4 \times 10^{15}$ atoms/cm$^2$ at an energy between 5 keV and 15 keV.

A first source structure 2026 is formed in the body region 2006 between the first MOS gate 2010 and the second MOS gate 2012. The first source structure 2026 has an n-type source diffused region 2028 and p-type body contact diffused regions 2030. In one realization of the instant embodiment, the source diffused region 2028 is formed concurrently with the centralized drain diffused region 2016 and the distributed drain diffused regions 2022. In one realization of the instant embodiment, the body contact diffused regions 2030 is formed concurrently with the first distributed SCR terminal 2018 and the second distributed SCR terminals 2024. Other realizations of a first source structure with different configurations of source diffused regions and body contact diffused regions are within the scope of the instant embodiment.

It will be recognized that a p-channel SCRMOS transistor may be formed in an integrated circuit as described in reference to FIG. 2A through FIG. 2C, with appropriate changes in polarities of dopants.

Figure 3:
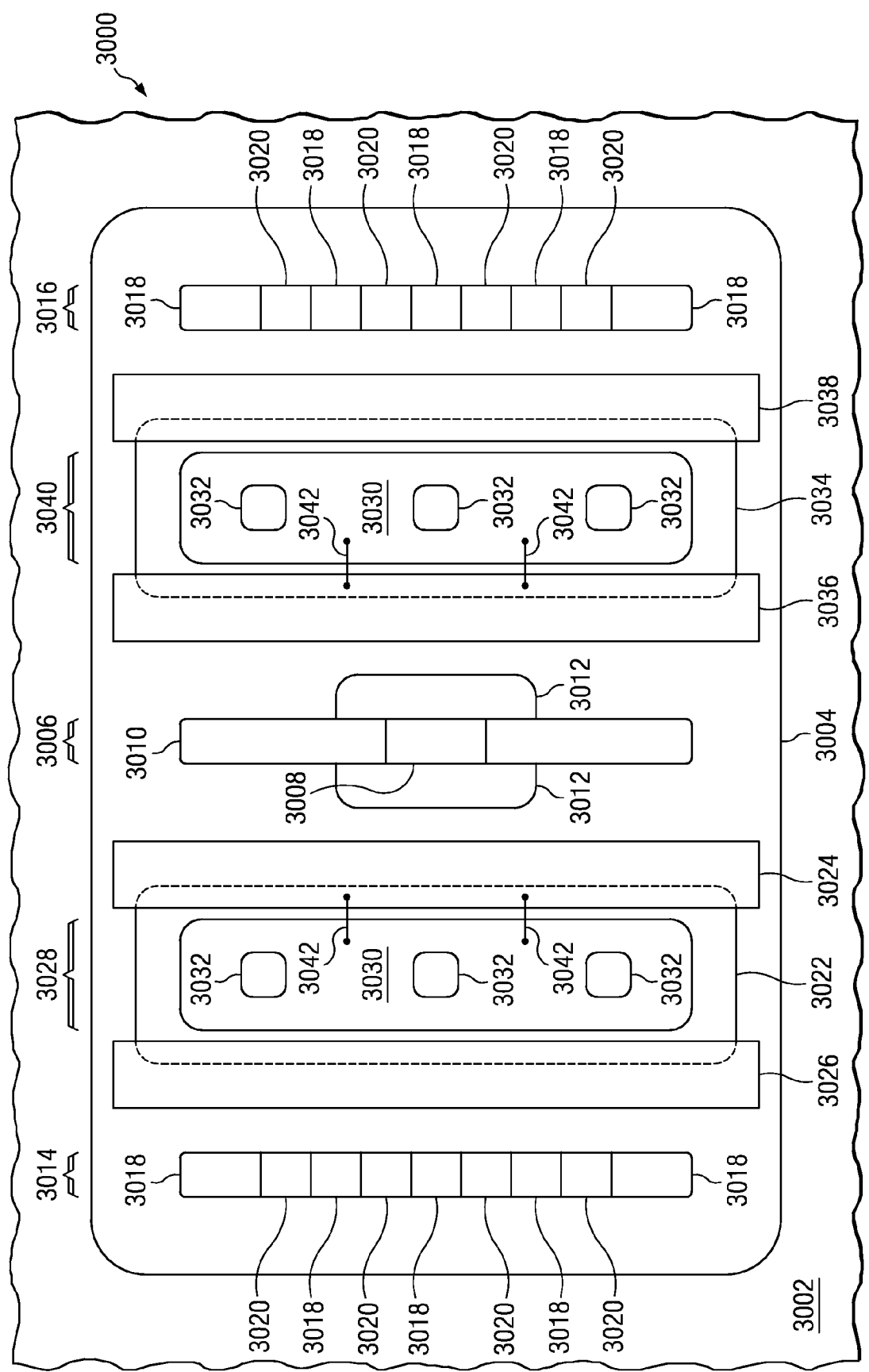
FIG. 3 is a top view of an integrated circuit having an n-channel SCRMOS transistor formed according to a second embodiment.

FIG. 3 is a top view of an integrated circuit having an n-channel SCRMOS transistor formed according to a second embodiment. The integrated circuit 3000 is formed in and on a semiconductor substrate 3002 as described in reference to FIG. 2A. A deep n-well 3004 is formed in the substrate 3002 as described in reference to FIG. 2A. Elements of field oxide are not depicted in FIG. 3 for clarity. A first drain structure 3006 has an n-type centralized drain diffused region 3008 and p-type first distributed SCR terminals 3010, formed in the deep n-well 3004 as described in reference to FIG. 2C. The centralized drain diffused region 3008 is centrally located in the first drain structure 3006 and extends less than half a length of the first drain structure 3006. In one realization of the instant embodiment, the centralized drain diffused region 3008 extends less than a third of the first drain structure 3006. The first distributed SCR terminals 3010 extend to each end of the first drain structure 3006.

An n-type RESURF region 3012 is formed around the centralized drain diffused region 3008, for example by ion implanting n-type dopants into the substrate 3002. The RESURF region 3012 extends under the centralized drain diffused region 3008. In one realization of the instant embodiment, the RESURF region 3012 may be formed by ion implanting phosphorus in a dose between $2 \times 10^{13}$ and $6 \times 10^{13}$ atoms/cm$^2$ at an energy between 250 keV and 500 keV. In the instant embodiment, the RESURF region 3012 does not surround the first drain structure 3006.

A second drain structure 3014 and optional third drain structure 3016 are formed in the deep n-well 3004 laterally separated from the first drain structure 3006. The second drain structure 3014 and third drain structure 3016 if present have distributed n-type drain diffused regions 3018 and p-type second distributed SCR terminals 3020. The distributed drain diffused regions 3018 extend substantially to each end of the second drain structure 3014 and third drain structure 3016 if present. In other realizations of the instant embodiment, drain diffused regions and SCR terminals may be configured differently in the second drain structure 3014 and third drain structure 3016 if present than as depicted in FIG. 3.

A p-type first body region 3022 is formed in the deep n-well 3004, as described in reference to FIG. 2A, between the first drain structure 3006 and the second drain structure 3014. A first MOS gate 3024 is formed over the substrate 3002 overlapping the first body region 3022 adjacent to the first drain structure 3006. A second MOS gate 3026 is formed over the substrate 3002 overlapping the first body region 3022 adjacent to the second drain structure 3014. The MOS gates 3024, 3026 are formed as described in reference to FIG. 2B. Sidewall spacers are not shown in FIG. 3 for clarity. Field plates are not shown in FIG. 3 for clarity.

The RESURF region 3012 is laterally separated from the first body region 3022. A doping density of the RESURF region 3012 is at least two times greater than a doping density of the deep n-well 3004 between the RESURF region 3012 and the first body region 3022. In one realization of the instant embodiment, the doping density of the RESURF region 3012 may be greater than $1 \times 10^{13}$ atoms/cm$^2$. In one realization of the instant embodiment, the doping density of the RESURF region 3012 may be between 5 and 50 times the doping density of the deep n-well 3004 between the RESURF region 3012 and the first body region 3022.

A first source structure 3028 is formed in the first body region 3022 as described in reference to FIG. 2C. The first source structure 3028 has an n-type source diffused region 3030 and p-type body contact diffused regions 3032. Other realizations of a first source structure with different configurations of source diffused regions and body contact diffused regions are within the scope of the instant embodiment.

Lateral spaces between the first drain structure 3006 and the first body region 3022 and between the second drain structure 3014 and the first body region 3022 are adjusted so that breakdown between the first drain structure 3006 and the first source structure 3028 is more probable than breakdown between the second drain structure 3014 and the first source structure 3028.

If the third drain structure 3016 is present, a p-type second body region 3034 is formed in the deep n-well 3004 between the first drain structure 3006 and the third drain structure 3016. A third MOS gate 3036 is formed over the substrate 3002 overlapping the second body region 3034 adjacent to the first drain structure 3006. A fourth MOS gate 3038 is formed over the substrate 3002 overlapping the second body region 3034 adjacent to the third drain structure 3016. A second source structure 3040 is formed in the second body region 3034. The second source structure 3040 includes a source diffused region 3030 and body contact diffused regions 3032. Lateral spaces between the first drain structure 3006 and the second body region 3034 and between the third drain structure 3016 and the second body region 3034 are adjusted so that breakdown between the first drain structure 3006 and the second source structure 3040 is more probable than breakdown between the third drain structure 3016 and the second source structure 3040.

The first MOS gate 3024 is electrically coupled to the source diffused region 3030 in the first source structure 3028 as depicted schematically in FIG. 3 by couplers 3042, so as to prevent formation of an inversion layer under the first MOS gate 3024. The third MOS gate 3036 if present is electrically coupled to the source diffused region 3030 in the second source structure 3040 by couplers 3042, so as to prevent formation of an inversion layer under the third MOS gate 3036.

During operation of the integrated circuit 3000, breakdown may occur between the first drain structure 3006 and the first source structure 3028, or between the first drain structure 3006 and the second source structure 3040 if present, as may occur for example in an electrostatic discharge (ESD) event. During breakdown, impact ionization may occur at and adjacent to a boundary between the RESURF region 3012 and the deep n-well 3004, generating holes which move toward the source diffused region 3030 and electrons which move through the RESURF region 3012 toward the centralized drain diffused region 3008. The electrons moving through the RESURF region 3012 may increase a potential difference between the centralized drain diffused region 3008 and the source diffused region 3030, causing a positive resistance relationship between a total current and a voltage difference between the centralized drain diffused region 3008 and the source diffused region 3030, which may in turn reduce current filament formation in the SCRMOS transistor. Breakdown current may trigger SCR current occur between the first drain structure 3006 and the first source structure 3028, or between the first drain structure 3006 and the second source structure 3040 if present, before current filaments form.

Realizations of SCRMOS transistors with other configurations of the first and second drain structures, source structures and other elements of the SCRMOS transistor than that depicted in FIG. 3 are within the scope of the instant embodiment. It will be recognized that a p-channel SCRMOS transistor may be formed in an integrated circuit as described in reference to FIG. 3, with appropriate changes in polarities of dopants.

Figure 4:
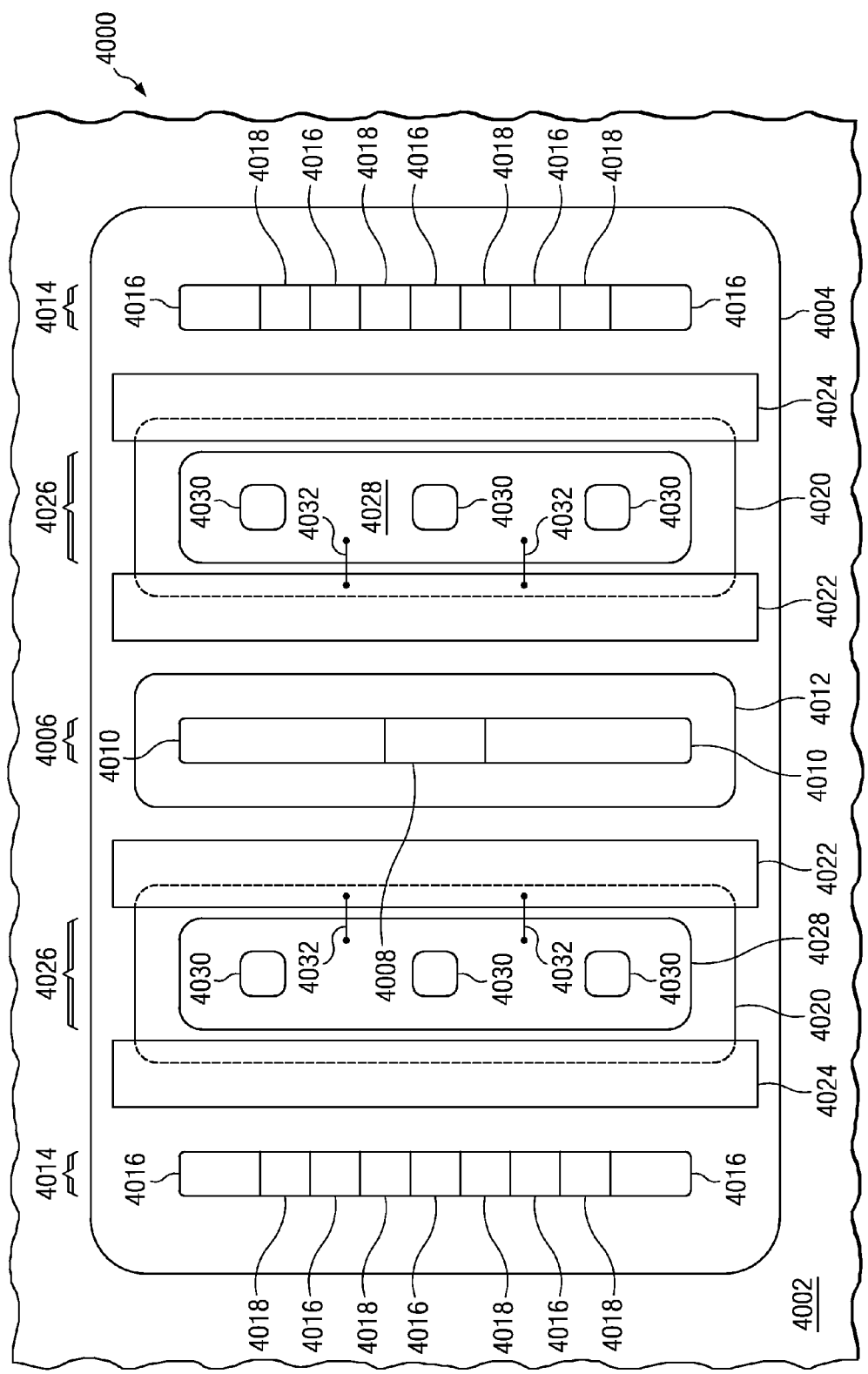
FIG. 4 is a top view of an integrated circuit having an n-channel SCRMOS transistor formed according to a third embodiment.

FIG. 4 is a top view of an integrated circuit having an n-channel SCRMOS transistor formed according to a third embodiment. Elements of field oxide, field plates, and sidewall spacers are not depicted in FIG. 4 for clarity. The integrated circuit 4000 is formed in and on a semiconductor substrate 4002 as described in reference to FIG. 2A. A deep n-well 4004 is formed in the substrate 4002 as described in reference to FIG. 2A. A first drain structure 4006 has an n-type centralized drain diffused region 4008 and p-type first distributed SCR terminals 4010, formed in the deep n-well 4004 as described in reference to FIG. 2C. An n-type RESURF region 4012 is formed as described in reference to FIG. 3, so as to laterally surround the first drain structure 4006. The RESURF region 4012 extends under the centralized drain diffused region 4008.

Second drain structures 4014 are formed in the deep n-well 4004 laterally separated from the first drain structure 4006. The second drain structures 4014 have distributed n-type drain diffused regions 4016 and p-type second distributed SCR terminals 4018. The distributed drain diffused regions 4016 extend substantially to each end of the second drain structures 4014. In other realizations of the instant embodiment, drain diffused regions and SCR terminals may be configured differently in the second drain structures 4014 than as depicted in FIG. 4.

P-type body regions 4020 are formed in the deep n-well 4004, as described in reference to FIG. 2A, between the first drain structure 4006 and the second drain structures 4014. First MOS gates 4022 are formed over the substrate 4002 overlapping the body regions 4020 adjacent to the first drain structure 4006. Second MOS gates 4024 are formed over the substrate 4002 overlapping the body regions 4020 adjacent to the second drain structures 4014. The MOS gates 4022, 4024 are formed as described in reference to FIG. 2B. The RESURF region 4012 is laterally separated from the body regions 4020. A doping density of the RESURF region 4012 is as described in reference to FIG. 3

Source structures 4026 are formed in the body regions 4020 as described in reference to FIG. 2C. The source structures 4026 have n-type source diffused regions 4028 and p-type body contact diffused regions 4030. Other realizations of source structures with different configurations of source diffused regions and body contact diffused regions are within the scope of the instant embodiment.

Lateral spaces between the first drain structure 4006 and the body regions 4020 and between the second drain structures 4014 and the body regions 4020 are adjusted so that breakdown between the first drain structure 4006 and the source structures 4026 is more probable than breakdown between the second drain structures 4014 and the source structures 4026. The first MOS gates 4022 are electrically coupled to the source diffused regions 4030 in the source structures 4026 by couplers 4032, so as to prevent formation of an inversion layer under the first MOS gates 4022.

During operation of the integrated circuit 4000, breakdown may occur between the first drain structure 4006 and the source structures 4026, as may occur for example in an electrostatic discharge (ESD) event. During breakdown, impact ionization may occur at and adjacent to a boundary between the RESURF region 4012 and the deep n-well 4004, generating holes which move toward the source diffused region 4028 and electrons which move through the RESURF region 4012 toward the centralized drain diffused region 4008. The electrons moving through the RESURF region 4012 may increase a potential difference between the centralized drain diffused region 4008 and the source diffused regions 4028, causing a positive resistance relationship between a total current and a voltage difference between the centralized drain diffused region 4008 and the source diffused regions 4028, which may in turn reduce current filament formation in the SCRMOS transistor. Breakdown current may trigger SCR current occur between the first drain structure 4006 and the source structures 4026, before current filaments form.

Realizations of SCRMOS transistors with other configurations of the first and second drain structures, source structures and other elements of the SCRMOS transistor than that depicted in FIG. 4 are within the scope of the instant embodiment. It will be recognized that an SCRMOS transistor may be fabricated as described in reference to FIG. 4 by omitting one adjacent set of the second drain structure 4014 and source structure 4026 and still posses the attributes recited above. It will be recognized that a p-channel SCRMOS transistor may be formed in an integrated circuit as described in reference to FIG. 4, with appropriate changes in polarities of dopants.

Figure 5:
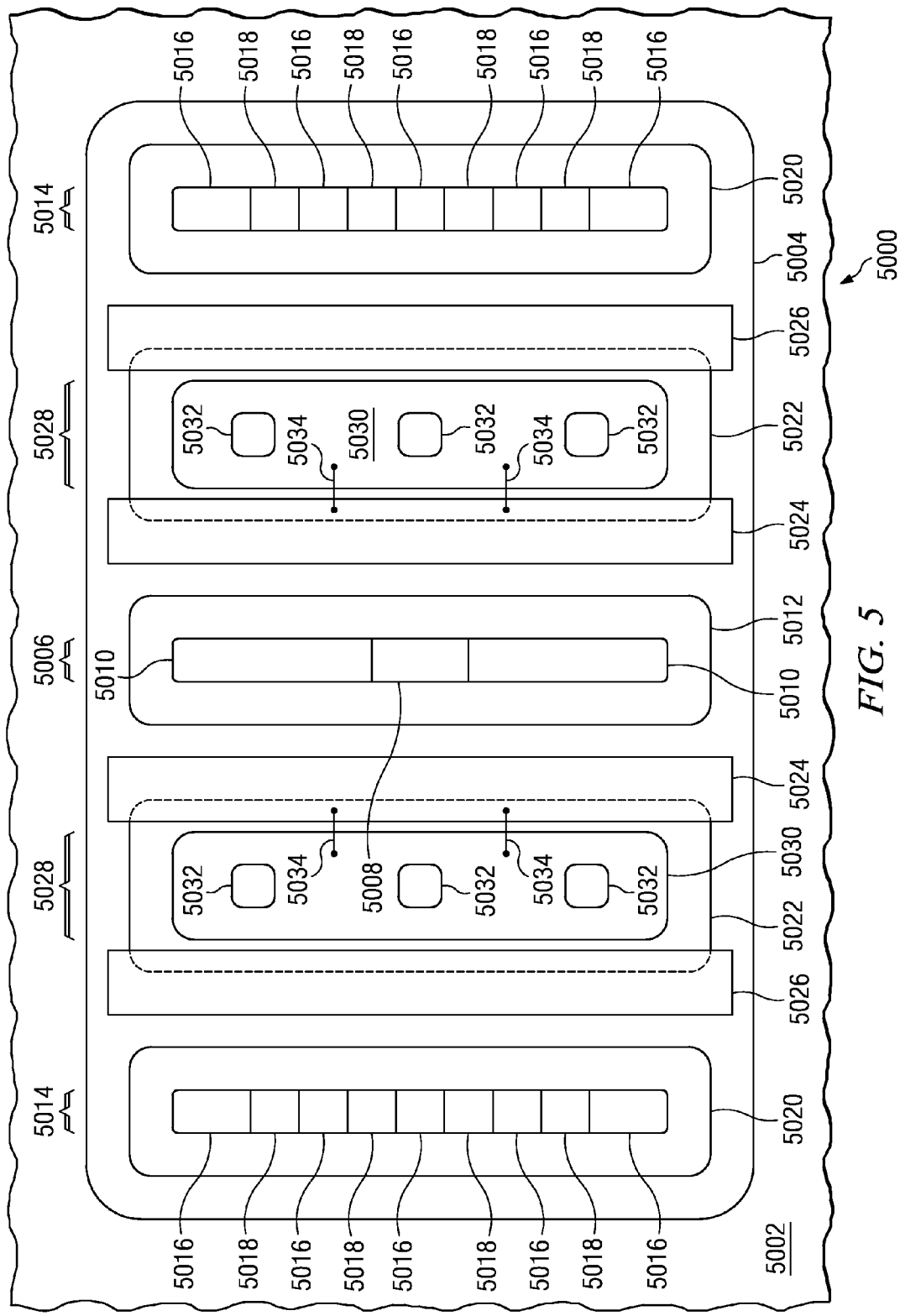
FIG. 5 is a top view of an integrated circuit having an n-channel SCRMOS transistor formed according to a fourth embodiment.

FIG. 5 is a top view of an integrated circuit having an n-channel SCRMOS transistor formed according to a fourth embodiment. Elements of field oxide, field plates, and sidewall spacers are not depicted in FIG. 5 for clarity. The integrated circuit 5000 is formed in and on a semiconductor substrate 5002 as described in reference to FIG. 2A. A deep n-well 5004 is formed in the substrate 5002 as described in reference to FIG. 2A. A first drain structure 5006 has an n-type centralized drain diffused region 5008 and p-type first distributed SCR terminals 5010, formed in the deep n-well 5004 as described in reference to FIG. 2C. An n-type first RESURF region 5012 is formed as described in reference to FIG. 3, so as to laterally surround the first drain structure 5006. The first RESURF region 5012 extends under the centralized drain diffused region 5008.

Second drain structures 5014 are formed in the deep n-well 5004 laterally separated from the first drain structure 5006. The second drain structures 5014 have distributed n-type drain diffused regions 5016 and p-type second distributed SCR terminals 5018. The distributed drain diffused regions 5016 extend substantially to each end of the second drain structures 5014. In other realizations of the instant embodiment, drain diffused regions and SCR terminals may be configured differently in the second drain structures 5014 than as depicted in FIG. 5. N-type second RESURF regions 5020 are formed as described in reference to FIG. 3 so as to laterally surround, and extend under, the second drain structures 5014.

P-type body regions 5022 are formed in the deep n-well 5004, as described in reference to FIG. 2A, between the first drain structure 5006 and the second drain structures 5014. First MOS gates 5024 are formed over the substrate 5002 overlapping the body regions 5022 adjacent to the first drain structure 5006. Second MOS gates 5026 are formed over the substrate 5002 overlapping the body regions 5022 adjacent to the second drain structures 5014. The MOS gates 5022, 5024 are formed as described in reference to FIG. 2B. The RESURF region 5012 is laterally separated from the body regions 5022. A doping density of the RESURF region 5012 is as described in reference to FIG. 3

Source structures 5028 are formed in the body regions 5022 as described in reference to FIG. 2C. The source structures 5028 have n-type source diffused regions 5030 and p-type body contact diffused regions 5032. Other realizations of source structures with different configurations of source diffused regions and body contact diffused regions are within the scope of the instant embodiment.

Lateral spaces between the first drain structure 5006 and the body regions 5022 and between the second drain structures 5014 and the body regions 5022 are adjusted so that breakdown between the first drain structure 5006 and the source structures 5028 is more probable than breakdown between the second drain structures 5014 and the source structures 5028. The first MOS gates 5024 are electrically coupled to the source diffused regions 5030 in the source structures 5028 by couplers 5034, so as to prevent formation of an inversion layer under the first MOS gates 5024.

During operation of the integrated circuit 5000, breakdown may occur between the first drain structure 5006 and the source structures 5028, as may occur for example in an electrostatic discharge (ESD) event. During such a breakdown occurrence, impact ionization may occur at and adjacent to a boundary between the RESURF region 5012 and the deep n-well 5004, generating holes which move toward the source diffused region 5030 and electrons which move through the RESURF region 5012 toward the centralized drain diffused region 5008. The electrons moving through the RESURF region 5012 may increase a potential difference between the centralized drain diffused region 5008 and the source diffused regions 5030, causing a positive resistance relationship between a total current and a voltage difference between the centralized drain diffused region 5008 and the source diffused regions 5030, which may in turn reduce current filament formation in the SCRMOS transistor. Breakdown current may trigger SCR current occur between the first drain structure 5006 and the source structures 5030, before current filaments form. Breakdown may also occur between the second drain structures 5014 and the source structures 5028. During such a breakdown occurrence, current filament formation may also be reduced as described in reference to breakdown between the first drain structure 5006 and the source structures 5028.

Realizations of SCRMOS transistors with other configurations of the first and second drain structures, source structures and other elements of the SCRMOS transistor than that depicted in FIG. 5 are within the scope of the instant embodiment. It will be recognized that an SCRMOS transistor may be fabricated as described in reference to FIG. 5 by omitting one adjacent set of the second drain structure 5014 and source structure 5028 and still posses the attributes recited above. It will be recognized that a p-channel SCRMOS transistor may be formed in an integrated circuit as described in reference to FIG. 5, with appropriate changes in polarities of dopants.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising;
   a semiconductor substrate; and
   an SCRMOS transistor formed in and on said substrate, said SCRMOS transistor having:
      a deep well formed in said substrate, said deep well having a first conductivity type;
      a first drain structure formed in said deep well, said first drain structure having:
         a centralized drain diffused region, said centralized drain diffused region having a same conductivity type as said deep well, such that said centralized drain diffused region is centrally located in said first drain structure and extends less than half a length of said first drain structure; and first distributed SCR terminals, said first distributed SCR terminals having an opposite conductivity type from said deep well, such that said first distributed SCR terminals extend to each end of said first drain structure;

a body region formed in said deep well adjacent to said first drain structure, said body region having an opposite conductivity type from said deep well;

a source structure formed in said body region, said source structure having:
- a source diffused region, said source diffused region having a same conductivity type as said deep well; and
- a body contact diffused region, said body contact diffused region having an opposite conductivity type from said deep well;

a second drain structure formed in said deep well adjacent to said body region opposite from said first drain structure, said second drain structure having:
- distributed drain diffused regions formed in said deep well, said distributed drain diffused regions having a same conductivity type as said deep well; and
- second distributed SCR terminals formed in said deep well, said second distributed SCR terminals having an opposite conductivity type from said deep well, such that a combination of said distributed drain diffused regions and said second distributed SCR terminals extend substantially to each end of said second drain structure;

a first MOS gate formed over said substrate, such that said first MOS gate overlaps said body region between said first drain structure and said source structure, and such that said first MOS gate is electrically coupled to said source diffused region; and a second MOS gate formed over said substrate, such that said second MOS gate overlaps said body region between said second drain structure and said source structure.

2. The integrated circuit of claim 1, in which said SCR-MOS transistor further includes a RESURF region formed in said deep well, such that:
said RESURF region has a same conductivity type as said deep well;
said RESURF region is formed around said centralized drain diffused region;
said RESURF region extends under said centralized drain diffused region;
said RESURF region is laterally separated from said body region; and
a doping density of said RESURF region is at least two times greater than a doping density of said deep well between the RESURF region and said body region.

3. The integrated circuit of claim 2, in which said RESURF region laterally surrounds said first drain structure.

4. The integrated circuit of claim 3, in which a second RESURF region laterally surrounds said second drain structure.

5. The integrated circuit of claim 1, in which:
said deep well is n-type;
said centralized drain diffused region is n-type;
said first distributed SCR terminals are p-type;
said body region is p-type;
said source diffused region is n-type;
said body contact diffused region is p-type;
said distributed drain diffused regions are n-type; and
said second distributed SCR terminals are p-type.

6. The integrated circuit of claim 1, in which:
said deep well is p-type;
said centralized drain diffused region is p-type;
said first distributed SCR terminals are n-type;
said body region is n-type;
said source diffused region is p-type;
said body contact diffused region is n-type;
said distributed drain diffused regions are p-type; and
said second distributed SCR terminals are n-type.

7. An SCRMOS transistor, comprising:
a deep well, said deep well having a first conductivity type;
a first drain structure formed in said deep well, said first drain structure having:
- a centralized drain diffused region, said centralized drain diffused region having a same conductivity type as said deep well, such that said centralized drain diffused region is centrally located in said first drain structure and extends less than half a length of said first drain structure; and
- first distributed SCR terminals, said first distributed SCR terminals having an opposite conductivity type from said deep well, such that said first distributed SCR terminals extend to each end of said first drain structure;

a body region formed in said deep well adjacent to said first drain structure, said body region having an opposite conductivity type from said deep well;

a source structure formed in said body region, said source structure having:
- a source diffused region, said source diffused region having a same conductivity type as said deep well; and
- a body contact diffused region, said body contact diffused region having an opposite conductivity type from said deep well;

a second drain structure formed in said deep well adjacent to said body region opposite from said first drain structure, said second drain structure having:
- distributed drain diffused regions formed in said deep well, said distributed drain diffused regions having a same conductivity type as said deep well; and
- second distributed SCR terminals formed in said deep well, said second distributed SCR terminals having an opposite conductivity type from said deep well, such that a combination of said distributed drain diffused regions and said second distributed SCR terminals extend substantially to each end of said second drain structure;

a first MOS gate formed over said deep well, such that said first MOS gate overlaps said body region between said first drain structure and said source structure, and such that said first MOS gate is electrically coupled to said source diffused region; and a second MOS gate formed over said deep well, such that said second MOS gate overlaps said body region between said second drain structure and said source structure.

8. The integrated circuit of claim 7, in which said SCR-MOS transistor further includes a RESURF region formed in said deep well, such that:
said RESURF region has a same conductivity type as said deep well;
said RESURF region is formed around said centralized drain diffused region;
said RESURF region extends under said centralized drain diffused region;

said RESURF region is laterally separated from said body region; and a doping density of said RESURF region is at least two times greater than a doping density of said deep well between the RESURF region and said body region.

9. The integrated circuit of claim 8, in which said RESURF region laterally surrounds said first drain structure.

10. The integrated circuit of claim 9, in which a second RESURF region laterally surrounds said second drain structure.

11. The integrated circuit of claim 7, in which:
said deep well is n-type;
said centralized drain diffused region is n-type;
said first distributed SCR terminals are p-type;
said body region is p-type;
said source diffused region is n-type;
said body contact diffused region is p-type;
said distributed drain diffused regions are n-type; and
said second distributed SCR terminals are p-type.

12. The integrated circuit of claim 7, in which:
said deep well is p-type;
said centralized drain diffused region is p-type;
said first distributed SCR terminals are n-type;
said body region is n-type;
said source diffused region is p-type;
said body contact diffused region is n-type;
said distributed drain diffused regions are p-type; and
said second distributed SCR terminals are n-type.

13. A process of forming an integrated circuit, comprising steps:
providing a semiconductor substrate, said substrate having a first conductivity type;
forming an SCRMOS transistor in and on said substrate by a process having steps:
  forming a deep well in said substrate so that said deep well has a first conductivity type;
  forming a body region in said deep well, so that said body region has an opposite conductivity type from said deep well;
  forming a first MOS gate over said substrate, so that said first MOS gate overlaps a first side of said body region;
  forming a second MOS gate over said substrate, so that said second MOS gate overlaps a second side of said body region opposite said first MOS gate;
  forming a first drain structure in said deep well adjacent to said first MOS gate opposite said body region, by a process having steps:
    forming a centralized drain diffused region in said substrate, so that said centralized drain diffused region has a same conductivity type as said deep well, and so that said centralized drain diffused region is centrally located in said first drain structure and extends less than half a length of said first drain structure; and
    forming first distributed SCR terminals in substrate, so that said first distributed SCR terminals has an opposite conductivity type from said deep well, and so that said first distributed SCR terminals extend to each end of said first drain structure;
  forming a source structure in said body region between said first MOS gate and said second MOS gate, by a process having steps:
    forming a source diffused region, so that said source diffused region has a same conductivity type as said deep well; and
    forming a body contact diffused region, so that said body contact diffused region has an opposite conductivity type from said deep well;
  forming a second drain structure in said deep well adjacent to said second MOS gate opposite said body region, by a process having steps:
    forming distributed drain diffused regions in said deep well, so that said distributed drain diffused regions have a same conductivity type as said deep well; and
    forming second distributed SCR terminals in said deep well, so that said second distributed SCR terminals have an opposite conductivity type from said deep well, and so that a combination of said distributed drain diffused regions and said second distributed SCR terminals extend substantially to each end of said second drain structure; and
  forming electrical coupling elements so that said first MOS gate is electrically coupled to said source diffused region.

14. The process of claim 13, in which said process of forming said SCRMOS transistor has an additional step of forming a RESURF region in said deep well, so that:
said RESURF region has a same conductivity type as said deep well;
said RESURF region is formed around said centralized drain diffused region;
said RESURF region extends under said centralized drain diffused region;
said RESURF region is laterally separated from said body region; and
a doping density of said RESURF region is at least two times greater than a doping density of said deep well between the RESURF region and said body region.

15. The process of claim 14, in which said process of forming said RESURF region is performed so that said RESURF region laterally surrounds said first drain structure.

16. The process of claim 15, in which said process of forming said SCRMOS transistor has an additional step of forming a second RESURF region so that said second RESURF region laterally surrounds said second drain structure.

17. The process of claim 13, in which:
said deep well is n-type;
said body region is p-type;
said centralized drain diffused region is n-type;
said first distributed SCR terminals are p-type;
said source diffused region is n-type;
said body contact diffused region is p-type;
said distributed drain diffused regions are n-type; and
said second distributed SCR terminals are p-type.

18. The process of claim 13, in which:
said deep well is p-type;
said body region is n-type;
said centralized drain diffused region is p-type;
said first distributed SCR terminals are n-type;
said source diffused region is p-type;
said body contact diffused region is n-type;
said distributed drain diffused regions are p-type; and
said second distributed SCR terminals are n-type.

19. The process of claim 13, in which:
said step of forming said deep well is performed by ion implanting dopants into said substrate;
said step of forming said body region is performed by ion implanting dopants into said substrate;

said step of forming said centralized drain diffused region is performed by ion implanting dopants into said substrate;
said step of forming said first distributed SCR terminals is performed by ion implanting dopants into said substrate;
said step of forming said source diffused region is performed by ion implanting dopants into said substrate;
said step of forming said body contact diffused region is performed by ion implanting dopants into said substrate;
said step of forming said distributed drain diffused regions is performed by ion implanting dopants into said substrate; and said step of forming said second distributed SCR terminals is performed by ion implanting dopants into said substrate.

20. The process of claim 13, in which:
said steps of forming said centralized drain diffused region, said source diffused region and said distributed drain diffused regions are performed concurrently; and
said steps of forming said first distributed SCR terminals, said body contact diffused region and said second distributed SCR terminals are performed concurrently.

* * * * *